(12) United States Patent
Mosden et al.

(10) Patent No.: US 7,291,446 B2
(45) Date of Patent: Nov. 6, 2007

(54) METHOD AND SYSTEM FOR TREATING A HARD MASK TO IMPROVE ETCH CHARACTERISTICS

(75) Inventors: Aelan Mosden, Poughkeepsie, NY (US); Dung Phan, Hyde Park, NY (US)

(73) Assignee: Tokyo Electron Limited, Tokyo (JP)

( * ) Notice: Subject to any disclaimer, the term of this patent is extended or adjusted under 35 U.S.C. 154(b) by 39 days.

(21) Appl. No.: 10/801,571

(22) Filed: Mar. 17, 2004

(65) Prior Publication Data
US 2005/0208434 A1 Sep. 22, 2005

(51) Int. Cl.
*G03F 7/26* (2006.01)

(52) U.S. Cl. .................... 430/316; 430/317

(58) Field of Classification Search ............... 430/316, 430/317
See application file for complete search history.

(56) References Cited

U.S. PATENT DOCUMENTS

| | | | | |
|---|---|---|---|---|
| 4,493,855 A | * | 1/1985 | Sachdev et al. | 438/670 |
| 5,114,529 A | * | 5/1992 | Masuyama et al. | 438/725 |
| 6,316,167 B1 | * | 11/2001 | Angelopoulos et al. | 430/313 |
| 6,818,383 B2 | * | 11/2004 | Kawai | 430/311 |
| 2003/0022526 A1 | * | 1/2003 | Vyvoda et al. | 438/788 |
| 2005/0051820 A1 | * | 3/2005 | Stojakovic et al. | 257/295 |

* cited by examiner

*Primary Examiner*—Kathleen Duda
(74) *Attorney, Agent, or Firm*—Oblon, Spivak, McClelland, Maier & Neustadt, P.C.

(57) ABSTRACT

During pattern transfer to a film stack, the hard mask layer, such as a tunable etch resistant antireflective coating (TERA), is consumed when etching the underling layer(s), leading to reduced etch performance and potential damage to the underlying layer(s), such as lack of profile control. A method of and system for preparing a structure on a substrate is described comprising: preparing a film stack comprising a thin film, a hard mask formed on the thin film, and a layer of light-sensitive material formed on the hardmask; forming a pattern in the layer of light-sensitive material; transferring the pattern to the hard mask; removing the layer of light-sensitive material; treating the surface layer of the hard mask in order to modify the surface; and transferring the pattern to the thin film.

17 Claims, 9 Drawing Sheets

METHOD AND SYSTEM FOR TREATING A HARD MASK TO IMPROVE ETCH CHARACTERISTICS

BACKGROUND OF THE INVENTION

1. Field of the Invention

The present invention relates to a method of treating a hard mask to improve etch characteristics and, more particularly, to a method of treating a hard mask in order to modify the surface layer of the hard mask.

2. Description of Related Art

In material processing methodologies, pattern etching includes the application of a patterned mask of radiation-sensitive material, such as photoresist, to a thin film on an upper surface of a substrate, and transferring the mask pattern to the underlying thin film by etching. The patterning of the radiation-sensitive material generally involves coating an upper surface of the substrate with a thin film of radiation-sensitive material and then exposing the thin film of radiation-sensitive material to a radiation source through a reticle (and associated optics) using, for example, a photolithography system. Then a developing process is performed, during which the removal of the irradiated regions of the radiation-sensitive material occurs (as in the case of positive photoresist), or the removal of non-irradiated regions occurs (as in the case of negative resist) using a base developing solution, or solvent. The remaining radiation-sensitive material exposes the underlying substrate surface in a pattern that is ready to be etched into the surface. Photolithographic systems for performing the above-described material processing methodologies have become a mainstay of semiconductor device patterning for the last three decades, and are expected to continue in that role down to 65 nm resolution, and less.

The resolution ($r_o$) of a photolithographic system determines the minimum size of devices that can be made using the system. Having a given lithographic constant $k_1$, the resolution is given by the equation $$r_o = k_1 \lambda / NA, \quad (1)$$

where $\lambda$ is the operational wavelength, and NA is the numerical aperture given by the equation $$NA = n \cdot \sin \theta_o. \quad (2)$$

Angle $\theta_o$ is the angular semi-aperture of the system, and n is the index of refraction of the material filling the space between the system and the substrate to be patterned.

Therefore, current lithographic trends involve increasing the numerical aperture (NA) in order to print smaller and smaller structures. However, although the increased NA permits greater resolution, the depth of focus for the images projected into the light-sensitive material is reduced, leading to thinner mask layers. As the light-sensitive layer thickness decreases, the patterned light-sensitive layer becomes less effective as a mask for pattern etching, i.e., most of the (light-sensitive) mask layer is consumed during etching. Without a dramatic improvement in etch selectivity, single layer masks have become deficient in providing the necessary lithographic and etch characteristics suitable for high resolution lithography.

An additional shortcoming of single layer masks is the control of critical dimension (CD). Substrate reflections at ultraviolet (UV) and deep ultraviolet (DUV) wavelengths are known to cause standing waves in the light-sensitive layer due to thin film interference. This interference manifests as periodic variations in light intensity in the light-sensitive layer during exposure resulting in vertically spaced striations in the light-sensitive layer and loss of CD.

In order to counter the effects of standing waves in the light-sensitive layer as well as provide a thicker mask for subsequent pattern etch transfer, a bilayer or multilayer mask can be formed that incorporates a bottom anti-reflective coating (BARC). The BARC layer includes a thin absorbing film to reduce thin film interference; however, the BARC layer can still suffer from several limitations including poor thickness uniformity due in part to spin-on deposition techniques.

A hard mask may also be used to provide improved maintenance of critical dimensions. The hard mask may be a vapor deposited thin film provided under the light sensitive layer to provide better etch selectivity than the light sensitive layer alone. This etch selectivity of the hard mask material permits use of a thinner mask that allows greater resolution while also allowing a deeper etch process. The present inventors have recognized, however, that the use of conventional hard masks have limited etch selectivity and resilience to etch processes that will limit their use in future generation devices with even smaller structures.

SUMMARY OF THE INVENTION

One aspect of the present invention is to reduce or eliminate any or all of the above-described problems.

Another object of the present invention is to provide a method of treating a hard mask to improve etch characteristics.

Yet another aspect of the present invention is to provide a method of treating an organosilicate layer.

Yet another aspect of the present invention is to provide a method of treating a tunable etch resistant anti-reflective (TERA) coating.

These and/or other aspects of the invention may be provided by a method of preparing a structure on a substrate including preparing a film stack having a thin film, a hard mask formed on the thin film, and a layer of light-sensitive material formed on the hard mask; forming a pattern in the layer of light-sensitive material; transferring the pattern to the hard mask; removing said layer of light-sensitive material; treating the surface layer of the hard mask in order to modify the surface layer; and transferring the pattern to the thin film.

According to yet another aspect, a chemically altered hard mask includes a hard mask layer and a chemically altered surface layer of the hard mask layer.

According to yet another aspect, a plasma processing system for treating a hard mask used for etching a feature in a thin film on a substrate includes: a process chamber; a substrate holder coupled to the process chamber and configured to support the substrate; means for introducing a treating gas; means for forming a plasma; and a controller coupled to the means for introducing the treating gas and the means for forming the plasma, and configured to execute a process recipe utilizing the plasma to chemically alter the surface layer of the hard mask.

DETAILED DESCRIPTION OF EXEMPLARY EMBODIMENTS

As described earlier, the use of a hard mask has been adopted to complement the lithographic structure, and can be utilized in applications where the specifications for critical dimensions are stringent. One variety of hard masks can be broadly classified as organosilicate materials, and one such organosilicate material is a tunable etch resistant anti-reflective (TERA) coating. These TERA coatings can be produced having a tunable index of refraction and extinction coefficient which can be optionally graded along the film thickness to match the optical properties of the substrate with the imaging light-sensitive layer; see U.S. Pat. No. 6,316,167, assigned to International Business Machines Corporation. As described in this patent, TERA films are used in lithographic structures for front end of line (FEOL) operations, such as gate formation, where control of the critical dimension is very important. In these applications, TERA coatings provide substantial improvement to the lithographic structure for forming gate devices at the 65 nm device node and smaller.

The present inventors have discovered, however, that conventional hard mask films such as TERA coatings can be damaged during processing steps. As noted above, in material processing methodologies, pattern etching utilizing such a lithographic structure generally includes the application of a thin layer of light-sensitive material, such as photoresist, to an upper surface of a substrate, that is subsequently patterned in order to provide a mask for transferring this pattern to the underlying hard mask during etching. Once the pattern is transferred to the hard mask, the layer of light-sensitive material is typically removed using an oxygenated plasma, and the pattern formed in the hard mask can be transferred to the underlying thin film. The present inventors have recognized that the conventional hard mask has an etch selectivity inherent to the material of the hard mask and which limits etch depth for a given thickness of hard mask. The present inventors have discovered that treatment of the hard mask material according to the present invention provides improved characteristics for the hard mask.

Figure 1A:
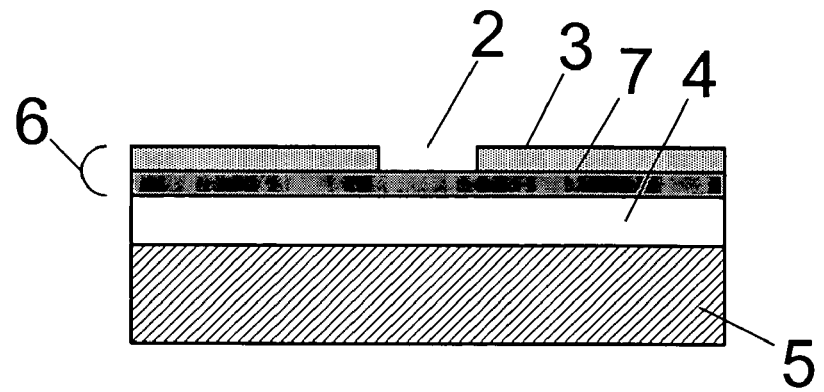
FIGS. 1A, 1B, and 1C show another schematic representation of a typical procedure for pattern etching a thin film.
Figure 1B:
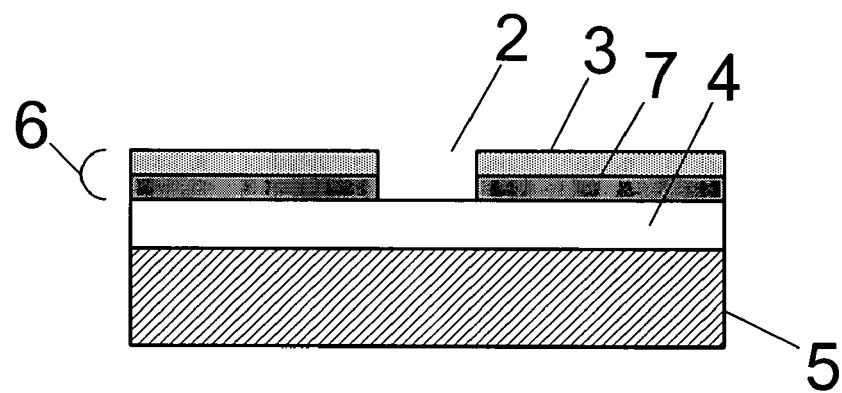
Figure 1C:
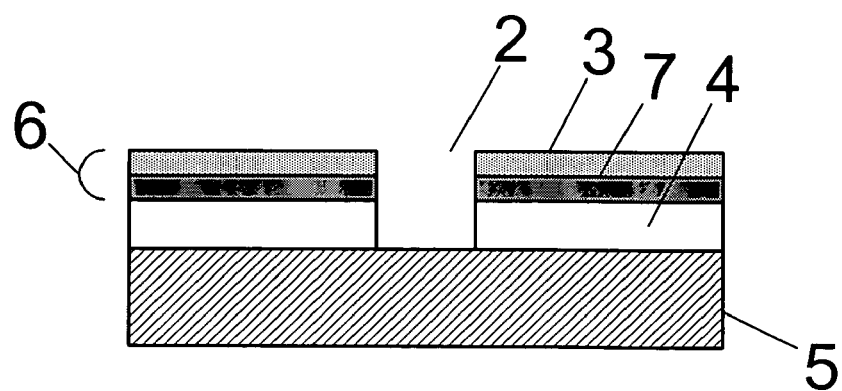

FIGS. 1A-1C show a conventional etching process to which a hard mask layer treatment process of the present invention can be applied. As shown in FIG. 1A, a bilayer mask 6 including light-sensitive layer 3 with pattern 2 formed using conventional lithographic techniques is formed on a hard mask layer 7, which is formed on a thin film 4 on top of a substrate 5. As seen in FIG. 1B, the hard mask 7 can be utilized as a mask for etching the thin film 4, wherein the mask pattern 2 in the light-sensitive layer 3 is transferred to the hard mask 7 using a separate etch step preceding the main etch step for the thin film 4. The main etch step to the film 4 is shown in FIG. 1C.

In one embodiment of the present invention, a process gas including an oxygen-containing gas is introduced to a plasma processing system in order to form an oxygen plasma. Thereafter, a substrate having a patterned hard mask, such as an organosilicate layer, is exposed to the oxygen plasma in order treat the exposed surface layer of the hard mask. In an alternate embodiment, the treatment of the hard mask is performed during the removal of the light-sensitive layer from the substrate. In yet another alternate embodiment, the treating of the hard mask is performed following the removal of the light-sensitive layer. The present inventors have discovered that treating the hard mask in this way improves the etch characteristics of the hard mask.

Specifically, the treated hard mask has an oxygenized hardened surface that has an improved etch selectivity over the untreated hard mask. This allows a deeper etch process to be performed for a given hard mask thickness. Moreover, the treated hard mask of the present invention provides greater control of critical dimension. As to this critical dimension improvement, the present inventors have recognized that even if a conventional untreated hard mask provides the appropriate thickness to perform a given etch process, poor resiliency of the hard mask at the pattern edges leads to break down of these edges during etching and, consequently, relatively poor control of the critical dimension of device features. Treating the hard mask according to the present invention is believed to make the pattern edges of the hard mask more resilient to semiconductor processes thereby allowing better control of critical dimension.

Figure 2A:
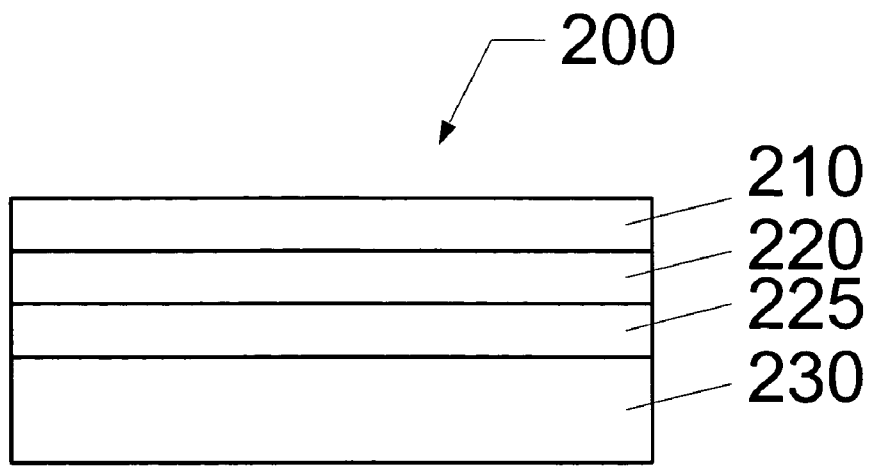
FIGS. 2A, 2B, and 2C illustrate a schematic representation of a method for treating a hard mask according to an embodiment of the present invention.
Figure 2B:
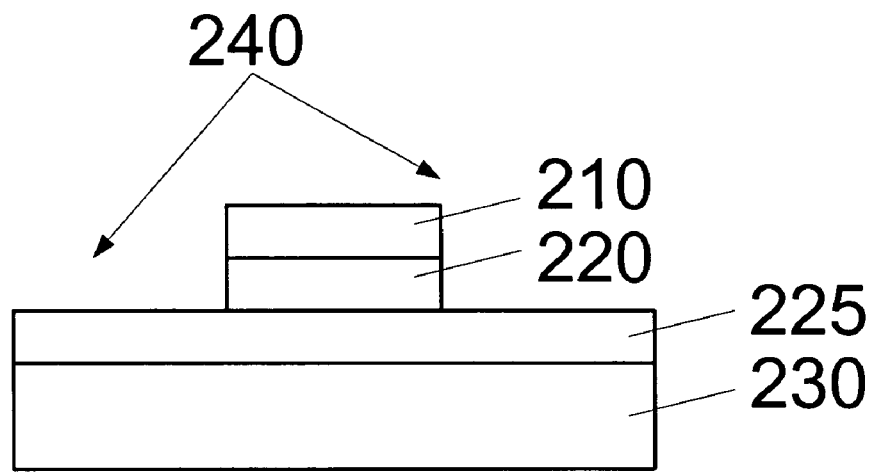
Figure 2C:
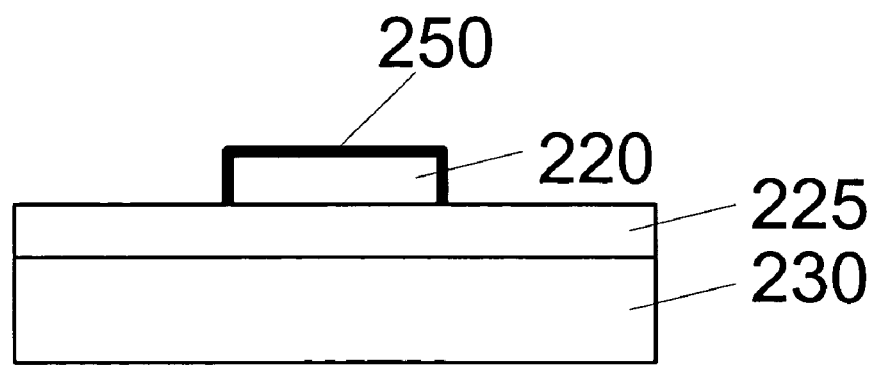
Figure 3:
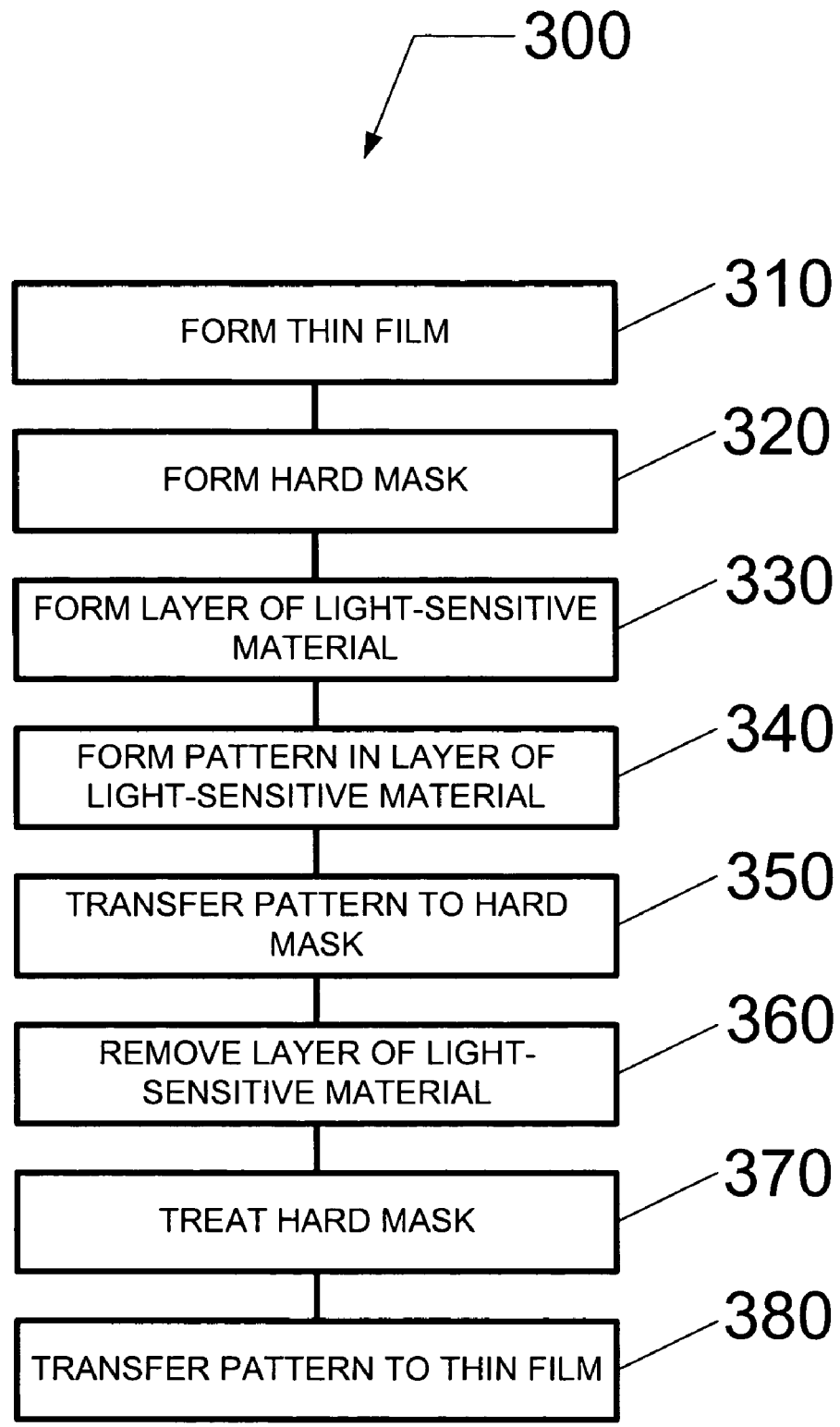
FIG. 3 shows a method for treating a hard mask according to an embodiment of the present invention.

In another embodiment, referring now to FIGS. 2A through 2C, and FIG. 3, a method of preparing a feature in a film stack is described. FIGS. 2A-2C show the film stack structure, while FIG. 3 describes process steps 310-380 performed on the film stack of FIGS. 2A-2C. As depicted in FIG. 2A and FIG. 3, a film stack 200 is prepared on a substrate 230, wherein the film stack 200 includes a thin film 225 formed on substrate 230 in step 310, a hard mask 220 formed on the thin film 225 in step 320, and a layer of light-sensitive material 210 formed on the hard mask 220 in step 330. The thin film 225 can include at least one of mono-crystalline silicon, poly-silicon, doped silicon, silicon nitride, silicon dioxide, a low dielectric constant (low-k) dielectric, etc. The thin film can be deposited using at least one of chemical vapor deposition (CVD), or spin-on techniques, each of which is well known to those skilled in the art.

The hard mask 220 can include an organosilicate layer. For example, the hard mask can include a tunable etch resistant anti-reflective (TERA) coating.

The TERA coating includes a structural formula R:C:H:X, wherein R is selected from the group consisting of Si, Ge, B, Sn, Fe, Ti, and combinations thereof, and wherein X is not present or is selected from the group consisting of one or more of O, N, S, and F. The TERA coating can be fabricated to demonstrate an optical range for index of refraction of approximately $1.40<n<2.60$, and for extinction coefficient of approximately $0.01<k<0.78$. Alternately, at least one of the index of refraction and the extinction can be graded (or varied) along a thickness of the TERA coating. Additional details are provided in U.S. Pat. No. 6,316,167, entitled "Tunable vapor deposited materials as antireflective coatings, hardmasks and as combined antireflective coating/hardmasks and methods of fabrication thereof and application thereof, assigned to International Business Machines Corporation; the entire contents of which are incorporated herein in their entirety. Furthermore, the TERA coating can be formed using PECVD, as described in greater detail in pending U.S. patent application Ser. No. 10/644,958, entitled "Method and apparatus for depositing materials with tunable optical properties and etching characteristics", filed on Aug. 21, 2003; the entire contents of which are incorporated herein in their entirety. The optical properties of the TERA coating, such as the index of refraction, can be selected so as to substantially match the optical properties of the underlying layer, or layers. For example, underlying layers such as non-porous dielectric films can require achieving an index of refraction in the range of $1.4<n<2.6$; and underlying layers such as porous dielectric films can require achieving an index of refraction in the range of $1.2<n<2.6$.

Additionally, for example, the layer of light-sensitive material 210 can include photoresist. For example, the layer (or layers) of light-sensitive material 210 can be formed using a track system. The track system can be configured for processing 248 nm resists, 193 nm resists, 157 nm resists, EUV resists, (top/bottom) anti-reflective coatings (TARC/BARC), and top coats. For example, the track system can include a Clean Track ACT 8, or ACT 12 resist coating and developing system commercially available from Tokyo Electron Limited (TEL). Other systems and methods for forming a photoresist film on a substrate are well known to those skilled in the art of spin-on resist technology.

Once the layer of light-sensitive material 210 is formed on film stack 200, it can be patterned with a pattern using micro-lithography in step 340, followed by the removal of the irradiated regions of the light-sensitive material (as in the case of positive photoresist), or non-irradiated regions (as in the case of negative resist) using a developing solvent. The micro-lithography system can include any suitable conventional stepping lithographic system, or scanning lithographic system. As shown in FIG. 2B, the pattern can be transferred to the hard mask 220 in step 350 using, for example, dry plasma etching. The dry plasma etch process can include a plasma chemistry containing at least one of the species selected from the group consisting of oxygen, fluorine, chlorine, bromine, hydrogen, and combinations thereof. Alternatively, the plasma chemistry can further include nitrogen or an inert gas, such as a Noble gas (i.e., helium, neon, argon, xenon, krypton, radon). Still alternatively, the plasma chemistry is chosen to exhibit high etch selectivity between the etch rate of the hard mask and the etch rate of the overlying patterned layer of light-sensitive material. Still alternatively, the plasma chemistry is chosen to exhibit high etch selectivity between the etch rate of the TERA coating and the etch rate of the underlying thin film. Once the pattern is transferred to the hard mask 220, the patterned hard mask can be utilized to transfer the pattern to the underlying thin film.

In step 360, the remaining light-sensitive material 210 is then removed using an oxygen-containing plasma. For example, the oxygen-containing plasma can be formed by introducing oxygen ($O_2$). In step 370, the surface of the exposed hard mask is treated using an oxygen-containing plasma in order to form a chemically altered layer 250 in the hard mask 220. In one embodiment, the layer of light-sensitive material is removed, and the surface layer of the hard mask is treated concurrently. Alternately, the surface layer of the hard mask is treated following the removal of the layer of light-sensitive material. For example, as described above, a treatment process for removing a light-sensitive material and treating a hard mask can include exposing the layers to an oxygen-containing plasma for 20 to 1400 seconds at a substrate holder temperature ranging from 20 C. to 400 C. For example, a substrate with a hard mask having a thickness of approximately 1000 can be exposed to an oxygen plasma for 60 seconds at a substrate holder temperature of 250 C. in order to remove the remaining layer of light-sensitive material, followed by exposure to the oxygen plasma for 120 seconds (i.e., 200% "over-treatment") at a substrate holder temperature of 250 C. in order to form a chemically altered layer having a thickness ranging from 10 (i.e., partially treated) to 1000 (i.e., fully treated). Additionally, for instance, if the substrate holder temperature is reduced (e.g., from 250 C.), then the exposure time can be increased to accommodate the slower process. Additionally, for example, the light-sensitive material can be exposed to an oxygen-containing plasma for 10 seconds to 200 seconds at a substrate holder temperature of 20 C. to 400 C., and the hard mask layer can be exposed to an oxygen-containing plasma for 10 seconds to 1200 seconds at a substrate holder temperature of 20 C. to 400 C.

Thereafter, in step 380, the pattern in the hard mask is transferred to the underlying thin film, using, for example, dry plasma etching. For instance, when etching silicon films, the etch gas composition generally includes at least one of $SF_6$, HBr, $Cl_2$, etc. Additionally, for example, when etching oxide dielectric films such as silicon oxide, silicon dioxide, etc., or when etching inorganic low-k dielectric films such as carbon doped silicon oxide materials, the etch gas composition generally includes a fluorocarbon-based chemistry such as at least one of $C_4F_8$, $C_5F_8$, $C_3F_6$, $C_4F_6$, $CF_4$, etc., and at least one of an inert gas, oxygen, or CO. Additionally, for example, when etching organic low-k dielectric films, the etch gas composition may include at least one of a fluorocarbon gas, a nitrogen-containing gas, a hydrogen-containing gas, or an oxygen-containing gas. The techniques for selectively etching a dielectric film, such as those described earlier, are well known to those skilled in the art of dielectric etch processes.

Figure 4A:
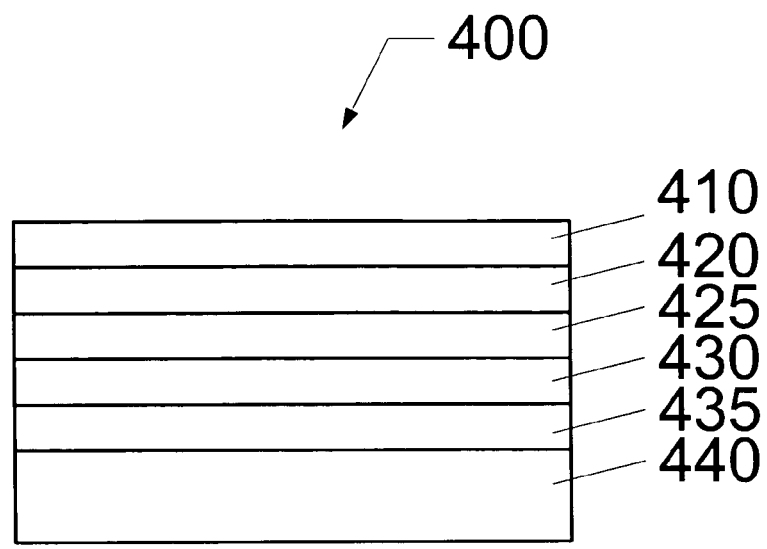
FIGS. 4A, 4B, and 4C illustrate a schematic representation of a method for treating a hard mask according to another embodiment of the present invention.
Figure 4B:
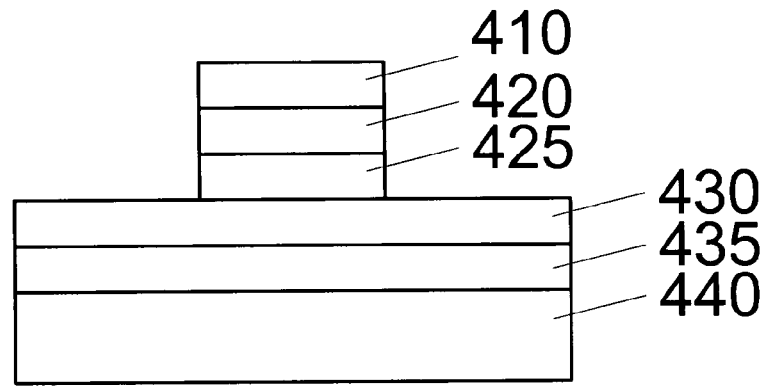
Figure 4C:
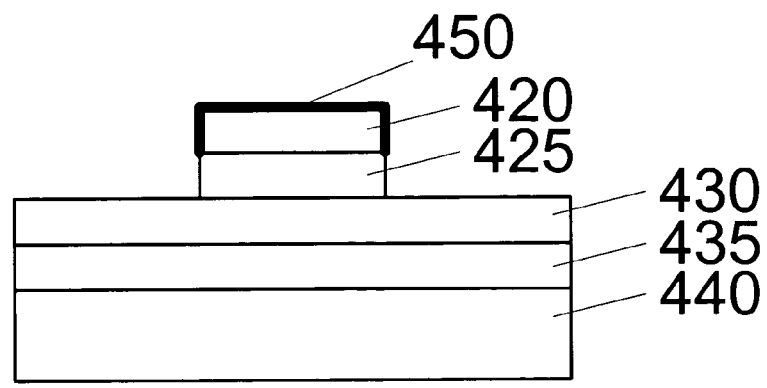

In yet another embodiment of the invention, referring now to FIGS. 4A through 4C, a method of preparing a feature in a film stack is described. As depicted in FIG. 4A, a film stack 400 is prepared on a substrate 440, wherein the film stack 400 includes a poly-silicon film 435 formed on substrate 440, a doped silicon film 430 formed on the poly-silicon film 435, a silicon nitride film 425 formed on the doped silicon film 430, a hard mask 420 formed on the silicon nitride film 425, and a layer of light-sensitive material 410 formed on the hard mask 420. Once a pattern is formed in the layer of light-sensitive material 410, the pattern is transferred to the hard mask, and to the underlying silicon nitride film 425. Thereafter, the layer of light-sensitive material 410 is removed, and the surface layer of the hard mask 420 is treated in order to form a chemically altered layer 450.

The etching process(es), the ashing process, and the treating process relating to a hard mask treating process of the present invention can be performed in a plasma processing system. The processes can be performed in the same plasma processing system, or in separate plasma processing systems.

Figure 5:
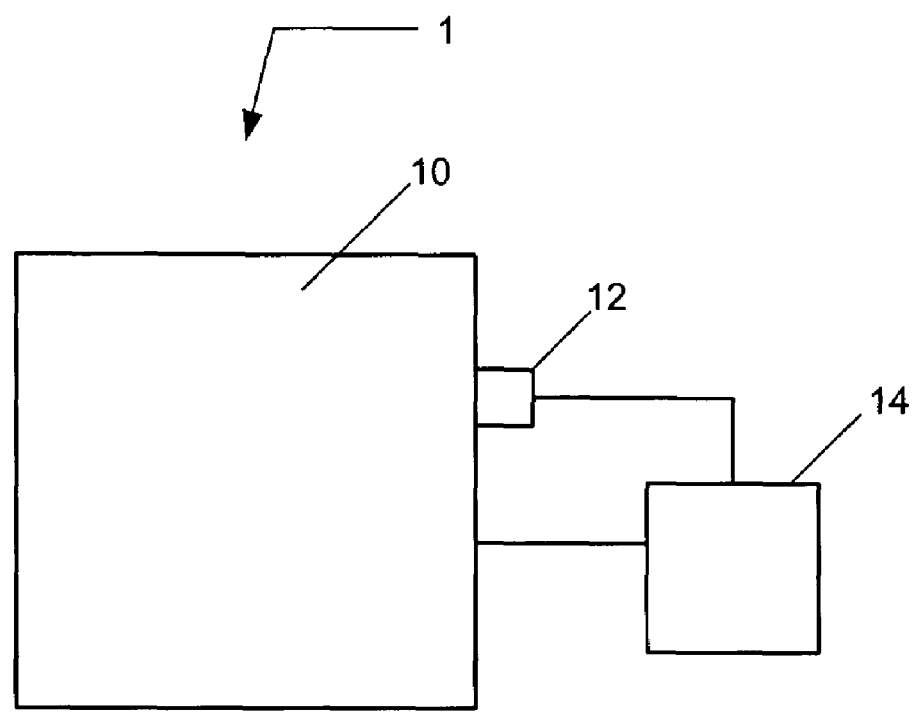
FIG. 5 shows a simplified schematic diagram of a plasma processing system according to an embodiment of the present invention.

For example, FIG. 5 presents an exemplary plasma processing system 1 that may be used to implement a process of the present invention. As seen in this Figure, the plasma processing system 1 includes a plasma processing chamber 10, a diagnostic system 12 coupled to the plasma processing chamber 10, and a controller 14 coupled to the diagnostic system 12 and the plasma processing chamber 10. The controller 14 is configured to execute a process recipe including at least one of an etching process, and an ashing process. Additionally, controller 14 is configured to receive at least one endpoint signal from the diagnostic system 12 and to post-process the at least one endpoint signal in order to accurately determine an endpoint for the process. In the illustrated embodiment, plasma processing system 1, depicted in FIG. 5, utilizes a plasma for material processing. Plasma processing system 1 can include an etch chamber, or an ash chamber.

Figure 6:
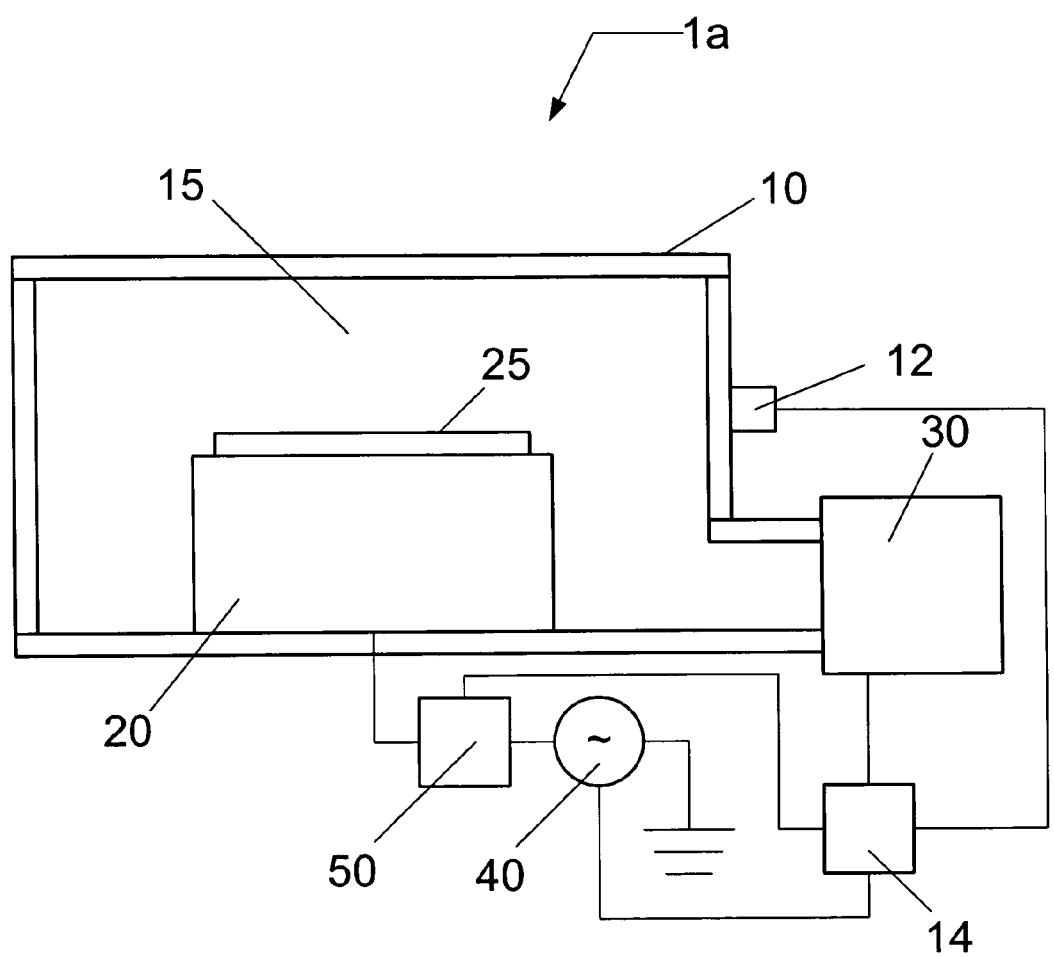
FIG. 6 shows a schematic diagram of a plasma processing system according to another embodiment of the present invention.

According to the embodiment depicted in FIG. 6, a plasma processing system 1$a$ used in accordance with the present invention can include plasma processing chamber 10, substrate holder 20, upon which a substrate 25 to be processed is affixed, and vacuum pumping system 30. Substrate 25 can be, for example, a semiconductor substrate, a wafer or a liquid crystal display. Plasma processing chamber 10 can be, for example, configured to facilitate the generation of plasma in processing region 15 adjacent a surface of substrate 25. An ionizable gas or mixture of gases is introduced via a gas injection system (such as a gas injection pipe, or gas injection showerhead) and the process pressure is adjusted. For example, a control mechanism (not shown) can be used to throttle the vacuum pumping system 30. Plasma can be utilized to create materials specific to a pre-determined materials process, and/or to aid the removal of material from the exposed surfaces of substrate 25. The plasma processing system 1$a$ can be configured to process 200 mm substrates, 300 mm substrates, or larger.

Substrate 25 can be, for example, affixed to the substrate holder 20 via an electrostatic clamping system. Furthermore, substrate holder 20 can, for example, further include a cooling system including a re-circulating coolant flow that receives heat from substrate holder 20 and transfers heat to a heat exchanger system (not shown), or when heating, transfers heat from the heat exchanger system. Moreover, gas can, for example, be delivered to the back-side of substrate 25 via a backside gas system to improve the gas-gap thermal conductance between substrate 25 and substrate holder 20. Such a system can be utilized when temperature control of the substrate is required at elevated or reduced temperatures. For example, the backside gas system can include a two-zone gas distribution system, wherein the helium gas gap pressure can be independently varied between the center and the edge of substrate 25. In other embodiments, heating/cooling elements, such as resistive heating elements, or thermoelectric heaters/coolers can be included in the substrate holder 20, as well as the chamber wall of the plasma processing chamber 10 and any other component within the plasma processing system 1$a$.

In the embodiment shown in FIG. 6, substrate holder 20 can include an electrode through which RF power is coupled to the processing plasma in process space 15. For example, substrate holder 20 can be electrically biased at a RF voltage via the transmission of RF power from a RF generator 40 through an impedance match network 50 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from 0.1 MHz to 100 MHz. RF systems for plasma processing are well known to those skilled in the art.

Alternately, RF power is applied to the substrate holder electrode at multiple frequencies. Furthermore, impedance match network 50 serves to improve the transfer of RF power to plasma in plasma processing chamber 10 by reducing the reflected power. Match network topologies (e.g. L-type, π-type, T-type, etc.) and automatic control methods are well known to those skilled in the art.

Vacuum pump system 30 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. For high pressure processing (i.e., greater than 100 mTorr), a mechanical booster pump and dry roughing pump can be used. Furthermore, a device for monitoring chamber pressure (not shown) can be coupled to the plasma processing chamber 10. The pressure measuring device can be, for example, a Type 628B Baratron absolute capacitance manometer commercially available from MKS Instruments, Inc. (Andover, Mass.).

Controller 14 includes a microprocessor, memory, and a digital I/O port capable of generating control voltages sufficient to communicate and activate inputs to plasma processing system 1$a$ as well as monitor outputs from plasma processing system 1$a$. Moreover, controller 14 can be coupled to and can exchange information with RF generator 40, impedance match network 50, the gas injection system (not shown), vacuum pump system 30, the diagnostic system 12, as well as the backside gas delivery system (not shown), the substrate/substrate holder temperature measurement system (not shown), and/or the electrostatic clamping system (not shown). For example, a program stored in the memory can be utilized to activate the inputs to the aforementioned components of plasma processing system 1$a$ according to a process recipe in order to perform an etching process, or an ashing process, or a treating process, or any combination thereof. One example of controller 14 is a DELL PRECISION WORKSTATION 610™, available from Dell Corporation, Austin, Tex.

Controller 14 can be locally located relative to the plasma processing system 1$a$, or it can be remotely located relative to the plasma processing system 1$a$. For example, controller 14 can exchange data with plasma processing system 1$a$ using at least one of a direct connection, an intranet, and the internet. Controller 14 can be coupled to an intranet at, for example, a customer site (i.e., a device maker, etc.), or it can be coupled to an intranet at, for example, a vendor site (i.e., an equipment manufacturer). Additionally, for example, controller 14 can be coupled to the internet. Furthermore, another computer (i.e., controller, server, etc.) can, for example, access controller 14 to exchange data via at least one of a direct connection, an intranet, and the internet.

The diagnostic system 12 can include an optical diagnostic subsystem (not shown). The optical diagnostic subsystem can include a detector such as a (silicon) photodiode or a photomultiplier tube (PMT) for measuring the light intensity emitted from the plasma. The diagnostic system 12 can further include an optical filter such as a narrow-band interference filter. In an alternate embodiment, the diagnostic system 12 can include at least one of a line CCD (charge coupled device), a CID (charge injection device) array, and a light dispersing device such as a grating or a prism. Additionally, diagnostic system 12 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The diagnostic system 12 can include a high resolution Optical Emission Spectroscopy (OES) sensor such as from Peak Sensor Systems, or Verity Instruments, Inc. Such an OES sensor has a broad spectrum that spans the ultraviolet (UV), visible (VIS), and near infrared (NIR) light spectrums. The resolution is approximately 1.4 Angstroms, that is, the sensor is capable of collecting 5550 wavelengths from 240 to 1000 nm. For example, the OES sensor can be equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

Furthermore, the diagnostic system 12 can include a system for performing optical digital profilometry, such as the system offered by Timbre Technologies, Inc. (2953 Bunker Hill Lane, Suite 301, Santa Clara, Calif. 95054).

Figure 7:
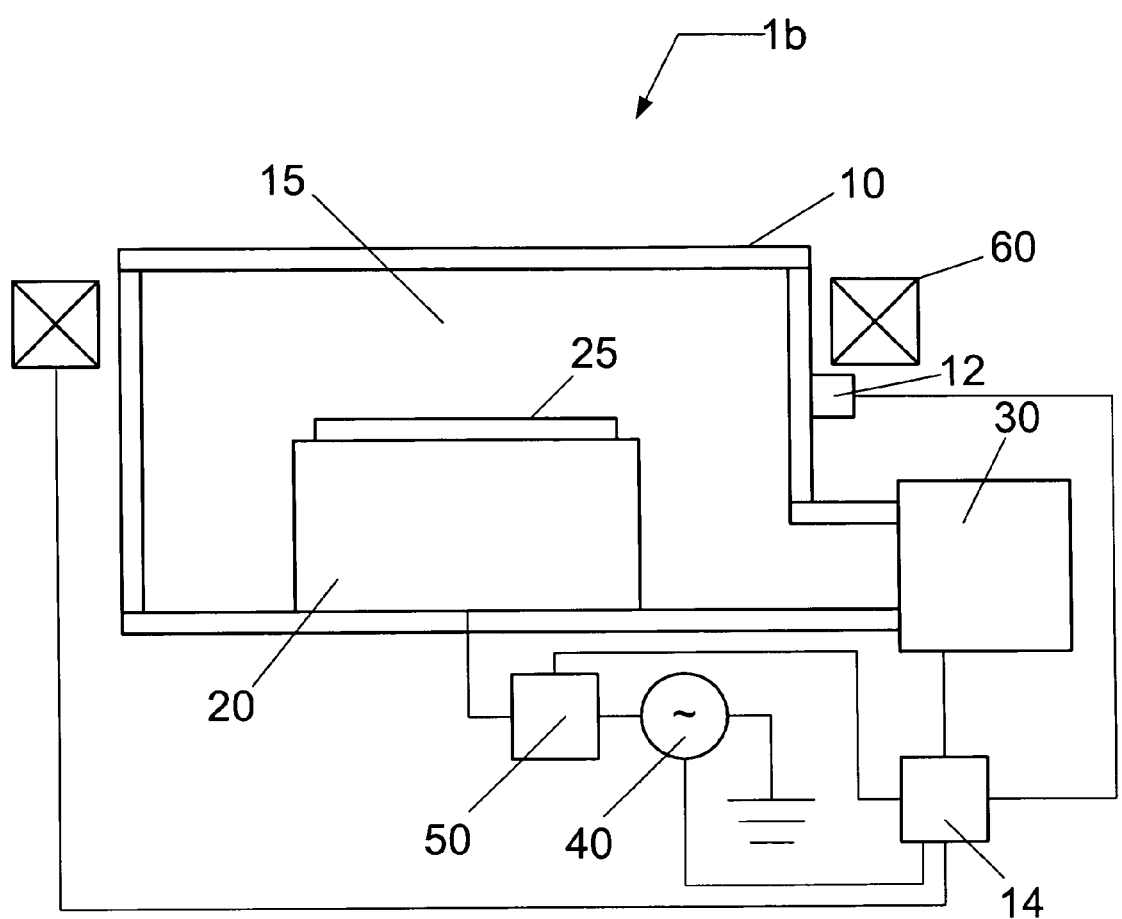
FIG. 7 shows a schematic diagram of a plasma processing system according to another embodiment of the present invention.

In the embodiment shown in FIG. 7, a plasma processing system 1b that may be used to implement the present invention can, for example, be similar to the embodiment of FIG. 5 or 6 and further include either a stationary, or mechanically or electrically rotating magnetic field system 60, in order to potentially increase plasma density and/or improve plasma processing uniformity, in addition to those components described with reference to FIG. 5 and FIG. 6. Moreover, controller 14 can be coupled to magnetic field system 60 in order to regulate the speed of rotation and field strength. The design and implementation of a rotating magnetic field is well known to those skilled in the art.

Figure 8:
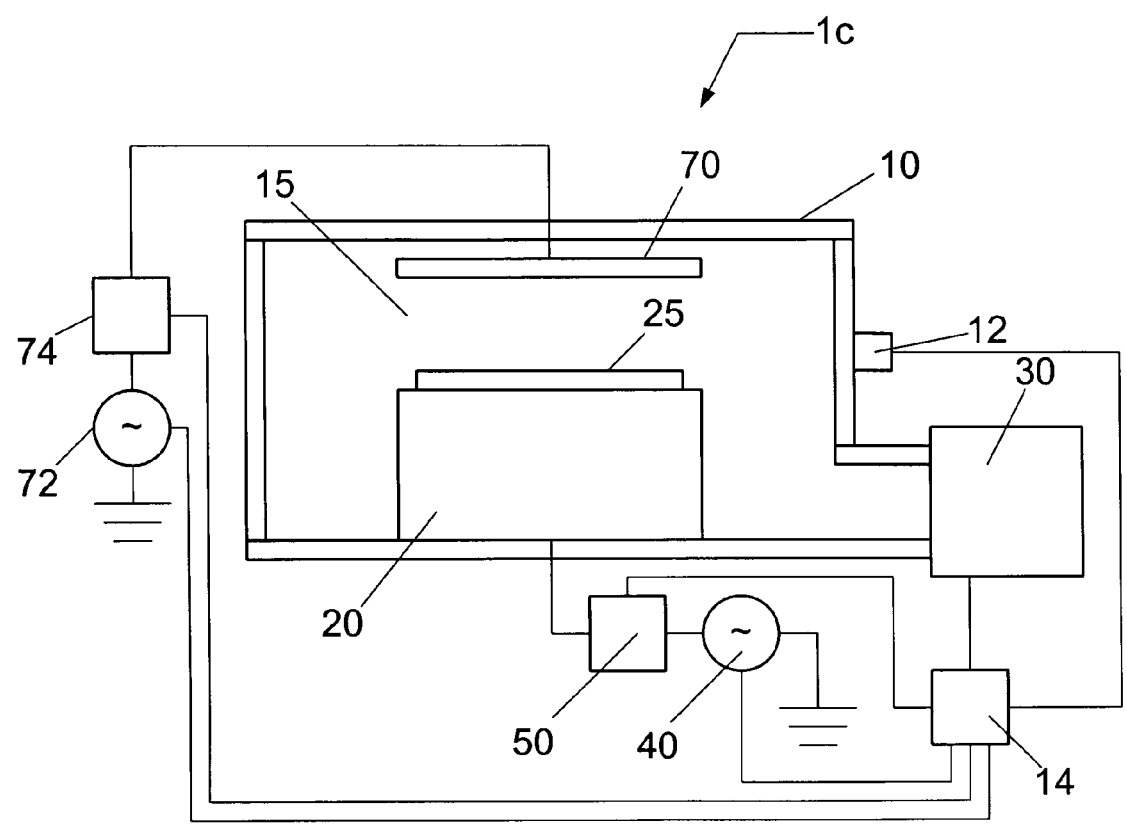
FIG. 8 shows a schematic diagram of a plasma processing system according to another embodiment of the present invention.

In the embodiment shown in FIG. 8, a plasma processing system 1c that may be used to implement the present invention can, for example, be similar to the embodiment of FIG. 5 or FIG. 6, and can further include an upper electrode 70 to which RF power can be coupled from RF generator 72 through impedance match network 74. A typical frequency for the application of RF power to the upper electrode can range from 0.1 MHz to 200 MHz. Additionally, a typical frequency for the application of power to the lower electrode can range from 0.1 MHz to 100 MHz. Moreover, controller 14 is coupled to RF generator 72 and impedance match network 74 in order to control the application of RF power to upper electrode 70. The design and implementation of an upper electrode is well known to those skilled in the art.

Figure 9:
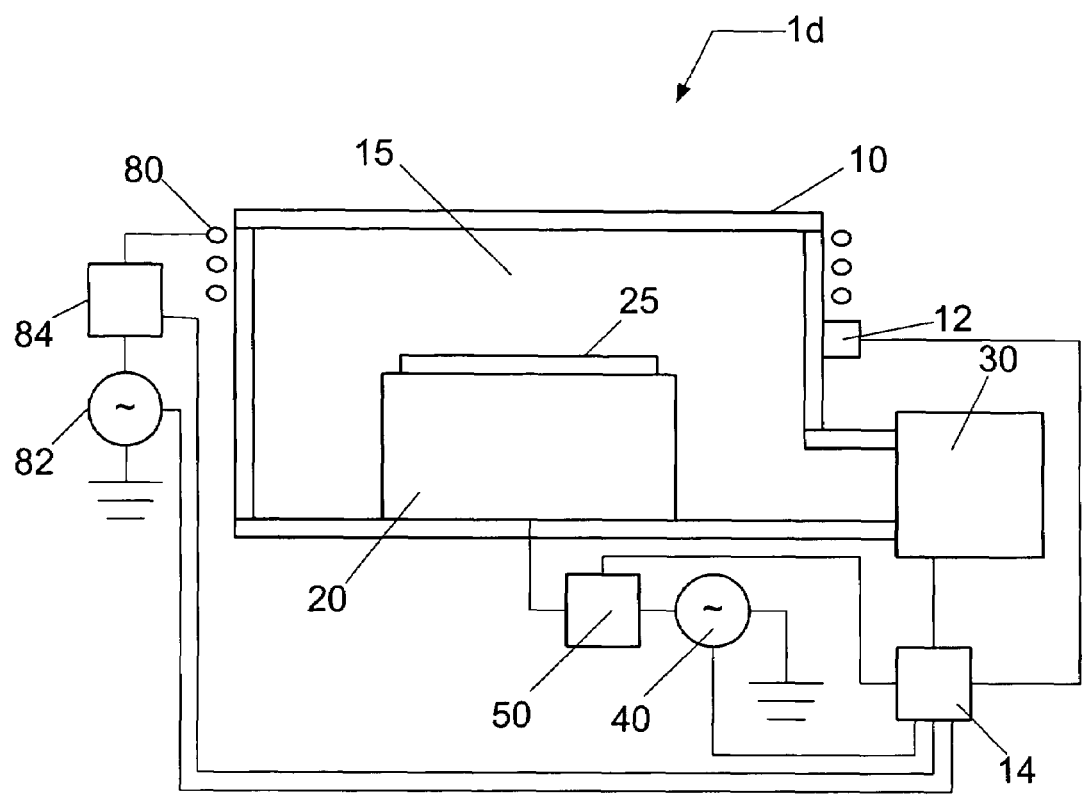
FIG. 9 shows a schematic diagram of a plasma processing system according to another embodiment of the present invention.

In the embodiment shown in FIG. 9, a plasma processing system 1d that may be used to implement the present invention can, for example, be similar to the embodiments of FIGS. 5 and 6, and can further include an inductive coil 80 to which RF power is coupled via RF generator 82 through impedance match network 84. RF power is inductively coupled from inductive coil 80 through dielectric window (not shown) to plasma processing region 45. A typical frequency for the application of RF power to the inductive coil 80 can range from 10 MHz to 100 MHz. Similarly, a typical frequency for the application of power to the chuck electrode can range from 0.1 MHz to 100 MHz. In addition, a slotted Faraday shield (not shown) can be employed to reduce capacitive coupling between the inductive coil 80 and plasma. Moreover, controller 14 is coupled to RF generator 82 and impedance match network 84 in order to control the application of power to inductive coil 80. In an alternate embodiment, inductive coil 80 can be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In general, the time to remove the layer of light-sensitive material can be determined using design of experiment (DOE) techniques; however, it can also be determined using endpoint detection. One possible method of endpoint detection is to monitor a portion of the emitted light spectrum from the plasma region that indicates when a change in plasma chemistry occurs due to substantially near completion of the removal of the layer of light-sensitive material from the substrate and contact with the underlying material film. For example, portions of the spectrum that indicate such changes include wavelengths of 482.5 nm (CO), and can be measured using optical emission spectroscopy (OES). After emission levels corresponding to those frequencies cross a specified threshold (e.g., drop to substantially zero or increase above a particular level), an endpoint can be considered to be complete. Other wavelengths that provide endpoint information can also be used. Furthermore, the ash time can be extended to include a period of over-ash, wherein the over-ash period constitutes a fraction (i.e. 1 to 100%) of the time between initiation of the ash process and the time associated with endpoint detection.

Additionally, the time for treating the hard mask to chemically alter the surface layer of the hard mask can be determined by design of experiment (DOE) techniques, or monitoring the thickness of the chemically altered surface layer. The thickness of the chemically altered surface layer can be determined using optical digital profilometry (ODP), as described above. After the thickness crosses a specified threshold (e.g., increase to or above a particular level), an endpoint of the treatment process can be considered to be complete. Furthermore, the treatment time can be extended to include a period of over-treatment, wherein the over-treatment period constitutes a fraction (i.e. 1 to 1000%) of the time between initiation of the treatment process and the time associated with endpoint detection.

For example, as described above, a treatment process for removing a light-sensitive material and treating a hard mask can include exposing the layers to an oxygen-containing plasma for 20 to 1400 seconds at a substrate holder temperature ranging from 20 C. to 400 C. For example, a substrate with a hard mask having a thickness of approximately 1000 can be exposed to an oxygen plasma for 60 seconds at a substrate holder temperature of 250 C. in order to remove the remaining layer of light-sensitive material, followed by exposure to the oxygen plasma for 120 seconds (i.e., 200% "over-treatment") at a substrate holder temperature of 250 C. in order to form a chemically altered layer having a thickness ranging from 10 to 1000 (i.e., fully oxidized). Additionally, for instance, if the substrate holder temperature is reduced (e.g., from 250 C.), then the exposure time can be increased to accommodate the slower process. Additionally, for example, the light-sensitive material can be exposed to an oxygen-containing plasma for 10 seconds to 200 seconds at a substrate holder temperature of 20 C. to 400 C., and the hard mask layer can be exposed to an oxygen-containing plasma for 10 seconds to 1200 seconds at a substrate holder temperature of 20 C. to 400 C.

Although embodiments have been presented for the treatment of a hard mask, such as a TERA coating, other hard mask materials can, in general, include organo-metallic compounds, or organo-silicon compounds.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of preparing a structure on a substrate comprising:
   preparing a film stack comprising a thin film, a hard mask formed on said thin film, and a layer of light-sensitive material formed on said hard mask, wherein said thin film comprising mono-crystalline silicon, poly-silicon, doped silicon, silicon nitride, silicon dioxide or a low dielectric constant material or a combination of two or more thereof, and wherein said hard mask comprising a tunable anti-reflective coating formed within said film stack having a structural formula R:C:H:X, wherein R is selected from the group consisting of Si, Ge, B, Sn, Fe, Ti, and combinations thereof, and wherein X is not present or is selected from the group consisting of one or more of O, N, S, and F;
   forming a pattern in said layer of light-sensitive material;
   transferring said pattern to said hard mask to form a patterned hard mask;
   removing said layer of light-sensitive material;
   treating a surface layer of said patterned hard mask after at least a portion of the light sensitive material is removed, in order to chemically alter said surface layer to a depth of at least 10 angstroms; and
   transferring said pattern to said thin film using said patterned treated hard mask as an etch mask,
   wherein said removing said light-sensitive material is followed by said treating said surface layer of said hard mask, said removing and said treating comprise exposing said substrate to an oxygen-containing plasma for an exposure time at a substrate holder temperature.

2. The method of claim 1, wherein said preparing comprises forming said hard mask comprising at least one of an organosilicon layer and an organo-metallic layer.

3. The method of claim 1, wherein said exposing said hard mask layer to said oxygen-containing plasma comprises exposing said hard mask layer to a plasma formed from the introduction of oxygen ($O_2$).

4. The method of claim 1, wherein said removing said light-sensitive layer and said treating said surface layer of said hard mask are performed within the same process chamber.

5. The method of claim 1, further comprising:
   determining an endpoint for completion of said removing said layer of light-sensitive material.

6. The method of claim 1, further comprising:
   determining an endpoint for completion of said treating said surface layer of said hard mask.

7. The method of claim 1, wherein said exposing said substrate to said oxygen-containing plasma for said exposure time at said substrate holder temperature includes exposing said substrate for said exposure time ranging from approximately 20 seconds to 1400 seconds, at said substrate holder temperature ranging from approximately 20 C. to 400 C.

8. A method of preparing a structure on a substrate comprising:
   preparing a film stack comprising a thin film, a hard mask formed on said thin film, and a layer of light-sensitive material formed on said hard mask, wherein said thin film comprising mono-crystalline silicon, poly-silicon, doped silicon, silicon nitride, silicon dioxide or a low dielectric constant material or a combination of two or more thereof, and wherein said hard mask comprising a tunable anti-reflective coating formed within said film stack having a structural formula R:C:H:X, wherein R is selected from the group consisting of Si, Ge, B, Sn, Fe, Ti, and combinations thereof, and wherein X is not present or is selected from the group consisting of one or more of O, N, S, and F;
   forming a pattern in said layer of light-sensitive material;
   transferring said pattern to said hard mask to form a patterned hard mask;
   removing said layer of light-sensitive material;
   treating a surface layer of said patterned hard mask after at least a portion of the light sensitive material is removed, in order to chemically alter said surface layer to a depth of at least 10 angstroms; and
   transferring said pattern to said thin film using said patterned treated hard mask as an etch mask,
   wherein said removing said light-sensitive material comprises exposing said light-sensitive material to an oxygen-containing plasma, and
   wherein said exposing said light-sensitive material to said oxygen-containing plasma includes setting an exposure time and a substrate holder temperature for said exposure.

9. The method of claim 8, wherein said setting said exposure time includes setting said exposure time for approximately 10 seconds to approximately 200 seconds.

10. The method of claim 8, wherein said setting said substrate holder temperature includes setting said substrate holder temperature at approximately 20 C. to 400 C.

11. The method of claim 8, wherein said setting said exposure time comprising setting the exposure time to a time that includes an over treatment exposure time of the hard mask after removal of the light sensitive material.

12. The method of claim 11, wherein said over treatment exposure time is 200% of an exposure time for removing the light sensitive layer.

13. The method of claim 11, wherein said over treatment exposure time is 10 to 1200 seconds.

14. The method of claim 13, further comprising setting a substrate temperature to between 20° C. and 400° C.

15. A method of preparing a structure on a substrate comprising:
   preparing a film stack comprising a thin film, a hard mask formed on said thin film, and a layer of light-sensitive material formed on said hard mask, wherein said thin film comprising mono-crystalline silicon, poly-silicon, doped silicon, silicon nitride, silicon dioxide or a low dielectric constant material or a combination of two or more thereof, and wherein said hard mask comprising a tunable anti-reflective coating formed within said film stack having a structural formula R:C:H:X, wherein R is selected from the group consisting of Si, Ge, B, Sn, Fe, Ti, and combinations thereof, and wherein X is not present or is selected from the group consisting of one or more of O, N, S, and F;

forming a pattern in said layer of light-sensitive material;

transferring said pattern to said hard mask to form a patterned hard mask;

removing said layer of light-sensitive material;

treating a surface layer of said patterned hard mask after at least a portion of the light sensitive material is removed, in order to chemically alter said surface layer to a depth of at least 10 angstroms; and transferring said pattern to said thin film using said patterned treated hard mask as an etch mask, wherein said treating said surface layer of said hard mask comprises exposing said hard mask layer to an oxygen-containing plasma, and wherein said exposing said hard mask layer to said oxygen-containing plasma includes setting an exposure time and a substrate holder temperature for said exposure.

16. The method of claim 15, wherein said setting said exposure time includes setting said exposure time for approximately 10 seconds to approximately 1200 seconds.

17. The method of claim 15, wherein said setting said substrate holder temperature includes setting said substrate holder temperature at approximately 20 C. to 400 C.

* * * * *